(12) United States Patent
Meinhold et al.

(10) Patent No.: US 6,436,843 B1
(45) Date of Patent: Aug. 20, 2002

(54) SYSTEM AND METHOD FOR COATING SUBSTRATES USING INK JET TECHNOLOGY

(75) Inventors: Henner Meinhold, San Jose; Fred J. Chetcuti, Millbrae; Judy Huang, Los Gatos, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/823,721

(22) Filed: Mar. 30, 2001

(51) Int. Cl.$^7$ .................. H01L 21/31; H01L 21/469; B05B 9/06
(52) U.S. Cl. .................. 438/758; 438/763; 438/780; 438/782; 118/323; 118/680
(58) Field of Search .................. 438/758, 763, 438/780, 782; 118/680, 323

(56) References Cited

U.S. PATENT DOCUMENTS

| | | | |
|---|---|---|---|
| 6,090,711 A | * 7/2000 | Batz, Jr. et al. | 438/689 |
| 6,015,462 A1 | * 1/2001 | Doolittle | 118/668 |
| 6,171,399 B1 | * 1/2001 | Kaiser et al. | 118/406 |
| 6,180,049 B1 | * 1/2001 | Jang et al. | 264/401 |
| 6,319,561 B1 | * 11/2001 | Bernard | 427/466 |
| 6,331,258 B1 | * 12/2001 | Silverbrook | 216/27 |

* cited by examiner

Primary Examiner—Alexander G. Ghyka
(74) Attorney, Agent, or Firm—Martine & Penilla, LLP (57) ABSTRACT

In a method for applying a coating material on a substrate, a print head is disposed over a substrate. Drops of a coating material are controllably dispensed from the print head to form a wide area film on the substrate. A system for coating a wafer includes a housing, and a chuck for supporting the wafer and a print head are disposed in the housing. A source of a coating material is coupled to the print head. A digital signal processor provides control signals for controlling process parameters for dispensing drops of the coating material and for controlling the relative position of the print head and the chuck. The relative position of the print head and the chuck (and hence the wafer supported thereon) may be controlled by moving the print head by itself, by moving the chuck by itself, or by moving both the print head and the chuck.

15 Claims, 8 Drawing Sheets

SYSTEM AND METHOD FOR COATING SUBSTRATES USING INK JET TECHNOLOGY

BACKGROUND OF THE INVENTION

The present invention relates generally to the coating of substrates and, more particularly, to systems and methods for coating substrates in the fabrication of semiconductor devices using ink jet technology.

Spin coating is used to form films over substrates in the fabrication of a variety of devices. For example, in the fabrication of semiconductor devices, films of photoresist materials, anti-reflective materials, and low dielectric constant materials (sometimes referred to as "low k materials") are spin coated over the surface of semiconductor wafers. In a typical spin coating operation in which a photoresist coating is applied over the surface of a wafer, photoresist fluid is applied on the surface of the wafer and the wafer is spun at high speeds in a spin bowl. The centrifugal force caused by the rotation of the wafer causes the photoresist fluid to spread over the surface of the wafer and form a film. Excess photoresist fluid that spins off the surface of the wafer drains from the spin bowl and is collected in a stationary drain bowl disposed below the spin bowl.

Unfortunately, the formation of films over substrates, e.g., semiconductor wafers, by spin coating suffers from at least five significant drawbacks. First, spin coating consumes a large quantity of the material being applied on the surface of the substrate. In a typical spin coating operation, roughly 95% of the material initially applied on the surface of the substrate is spun off during the operation. Second, the excess material generated during the spin coating operation must be disposed of in accordance with relatively expensive waste management procedures to minimize the impact on the environment. Third, spin-coated wafers typically require edge bead removal to provide a clean edge area that can be gripped by robotic wafer handling equipment. The solvents used in edge bead removal processes also must be disposed of in accordance with waste management procedures. Fourth, spin-coated wafers typically require backside rinsing to remove contaminants from the backside of the wafer. Fifth, spin coating does not afford a wide range of film thickness control in that the viscosity of a material limits the minimum film thickness and the maximum film thickness that can be obtained at a reasonable coating uniformity. Consequently, it may not be possible to obtain a specified film thickness for a given material by spin coating.

In view of the foregoing, there is a need for a method for coating substrates that efficiently uses the material being applied on the substrate, does not require waste management, edge bead removal, or backside rinsing, and provides a wide range of film thickness control.

SUMMARY OF THE INVENTION

Broadly speaking, the present invention fills this need by providing a system and method for coating substrates using ink jet technology. In the system and method, drops of coating material are dispensed from a print head onto the substrate.

In accordance with one aspect of the present invention, a method for coating a substrate is provided. In this method, a print head is disposed over a surface of a substrate, which may be a semiconductor, an insulator, or a conductor. A first drop of a coating material is dispensed from the print head to form a first dot of the coating material on the surface of the substrate. A second drop of the coating material is dispensed from the print head to form a second dot of the coating material on the surface of the substrate. The second dot overlaps the first dot to form a homogeneous film of the coating material on the surface of the substrate. The degree to which the dots overlap may be varied between having the dots just touch one another and having just less than 100% overlap, i.e., having the dots formed substantially on top of one another.

In one embodiment, the substrate is comprised of a material selected from the group consisting of silicon, gallium arsenide, silicon germanium, glass, aluminum, and copper. In one embodiment, the coating material may be a polymer, a solvent media containing a solute, an aqueous media containing a solute, and a dispersed colloidal suspension. Exemplary coating materials include low dielectric constant materials, photoresist materials, and antireflective coating materials.

In accordance with another aspect of the present invention, a method for applying a coating material on a substrate is provided. In this method, a print head is disposed over the substrate, and drops of a coating material are controllably dispensed from the print head to form a wide area film on a surface of the substrate. In one embodiment, the substrate may be a semiconductor wafer. In one embodiment, an ultraflat wide area film may be formed on the surface of the substrate.

In accordance with yet another aspect of the present invention, a system for coating a semiconductor wafer is provided. This system includes a housing, and a chuck for supporting a semiconductor wafer is disposed in the housing. A print head is movably disposed in the housing above the chuck such that the print head is movable in first and second dimensions over the chuck. A source of a coating material is coupled to the print head. A digital signal processor provides control signals for controlling process parameters for dispensing drops of the coating material from the print head and provides control signals for controlling a position of the print head relative to the chuck.

In one embodiment, the process parameters for dispensing drops of the coating material from the print head and the position of the print head relative to the chuck may be controlled to form a wide area film on a surface of a semiconductor wafer being supported on the chuck. In one embodiment, the first and second dimensions define a plane over the chuck, and the print head is movable in the plane. In one embodiment, the system further includes a maintenance station for performing maintenance operations on the print head.

In one alternative embodiment of the system, the chuck is movably disposed in the housing below the print head such that the chuck is movable in first and second dimensions under the print head. In this alternative embodiment, the process parameters for dispensing drops of the coating material from the print head and the position of the print head relative to the chuck may be controlled to form a wide area film on a surface of a semiconductor wafer being supported on the chuck. In one embodiment, the first and second dimensions define a plane under the print head, and the chuck is movable in the plane.

In another alternative embodiment of the system, the chuck is movably disposed in the housing such that the chuck is movable in a first dimension, and the print head is movably disposed in the housing above the chuck such that the print head is movable in a second dimension. In this alternative embodiment, the process parameters for dispensing drops of the coating material from the print head, the position of the chuck relative to the print head in the first dimension, and the position of the print head relative to the chuck in the second dimension may be controlled to form a wide area film on a surface of a semiconductor wafer being supported on the chuck. In one embodiment, the first dimension is an X dimension and the second dimension is a Y dimension.

The system and method for coating substrates of the present invention provide a number of significant advantages relative to spin coating. These advantages include conserving expensive coating material (because the print head dispenses coating material onto only those portions of the substrate where film coverage is desired), eliminating the need for edge bead removal (because a film is not formed on the edge exclusion area), eliminating the need for waste management (because coating material is not wasted and no edge bead removal, which uses solvents, is needed), and eliminating the need for backside rinsing (because coating material is not deflected onto the backside of the substrate during the coating operation). The system and method of the present invention are further advantageous because they enable the pattern, thickness, thickness profile, and smoothness of a film to be modulated over the substrate.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIGS. 5C–5E are schematic diagrams that illustrate the formation of a pattern of dots on a substrate by a print head implementing another set of process parameters adapted to form a wide area film.

DETAILED DESCRIPTION OF THE INVENTION

Several exemplary embodiments of the invention will now be described in detail with reference to the accompanying drawings.

Figure 1A:
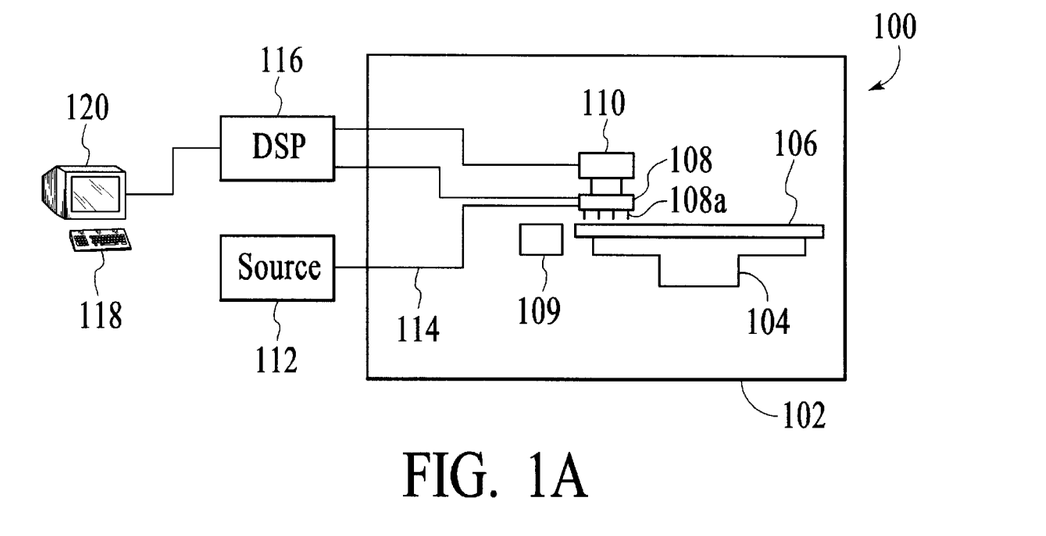
FIG. 1A is a simplified schematic diagram of a system for coating a semiconductor wafer in accordance with one embodiment of the present invention.

FIG. 1A is a simplified schematic diagram of a system for coating a semiconductor wafer in accordance with one embodiment of the present invention. As shown in FIG. 1A, system 100 includes housing 102 in which chuck 104, wafer 106, print head 108, maintenance station 109, and positioner 110 are disposed. Chuck 104 supports wafer 106 during the coating operation. Those skilled in the art are familiar with well-known chucks for supporting wafers. For substrates other than wafers, the term "chuck" refers to any suitable clamp or holder for supporting the substrate during the coating operation. Print head 108 is movably disposed above chuck 104 and wafer 106. Print head 108 dispenses drops of the coating material through nozzles 108a onto the surface of wafer 106, as will be described in more detail below. Print head 108 may be any suitable commercially available ink jet print head. In some applications, it may be necessary to modify the print head so that the materials from which the print head is formed do not contaminate the wafer. Maintenance station 109 is situated proximate to chuck 104 on which wafer 106 is supported. Positioner 110 is coupled to print head 108 and moves the print head over wafer 106 along a desired path, as described below with reference to FIG. 1B. Source 112 of the material to be coated on wafer 106 is coupled to print head 108 by supply line 114. Digital signal processor 116 is coupled to print head 108, positioner 110, and computer 118.

Figure 1B:
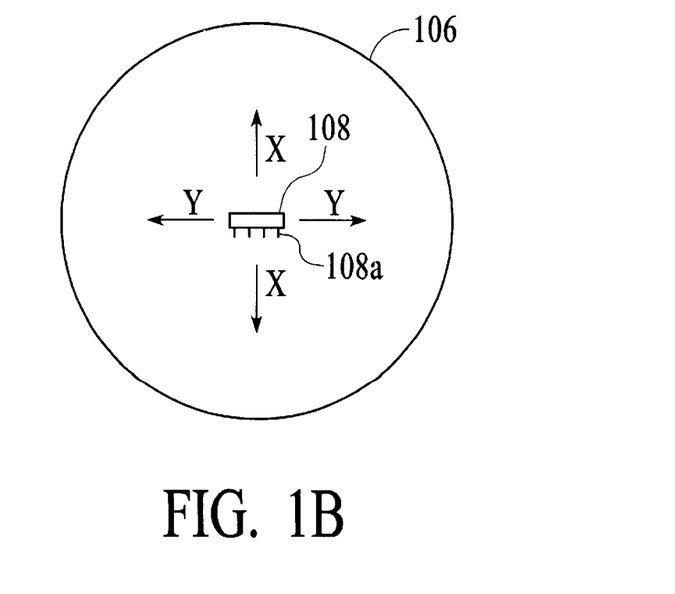
FIG. 1B is a simplified schematic diagram that illustrates the manner in which the print head moves relative to the wafer during a coating operation using the system shown in FIG. 1A.

FIG. 1B is a simplified schematic diagram that illustrates the manner in which print head 108 moves relative to wafer 106 during a coating operation using system 100. As shown in FIG. 1B, print head 108 moves in the X and Y dimensions relative to wafer 106. In one embodiment, the X dimension and the Y dimension define a plane above the surface of wafer 106. As set forth above in connection with the description of FIG. 1A, positioner 110 moves print head 108 over wafer 106 along a desired path. Positioner 110 may be any suitable transport mechanism for precisely moving the print head in two dimensions over the wafer. In one embodiment, positioner 110 is a motorized, two-axis (X-Y) stage. By way of example, positioner 110 may move print head 108 over wafer 106 in a systematic, back-and-forth manner in which the print head first moves up (or down) a first "column" in the X dimension, then moves across the wafer in the Y dimension to a second column, and then moves down (or up) the second column in the X dimension. This back-and-forth movement may be repeated until print head 108 has moved over all of the selected surface of wafer 106 that is to be coated. To perform maintenance operations on print head 108, the print head may be moved over to maintenance station 109. By way of example, the maintenance operations may include cleaning the lip of the print head and applying appropriate solvents to the nozzles to prevent them from clogging or drying out.

To coat a wafer using system 100, recipe 120, which contains instructions for the coating operation, is input into computer 118. In one embodiment, recipe 120 includes instructions for controlling the position of print head 108 relative to chuck 104 (and hence relative the surface of wafer 106 supported thereon) and instructions for controlling the process parameters for dispensing drops of the coating material from the print head. Additional details regarding the process parameters for dispensing drops of the coating material from print head 108 are set forth below in connection with the description of the method for coating substrates of the present invention.

Digital signal processor 116 processes the instructions in recipe 120 and provides suitable control signals for the desired coating operation. In one embodiment, digital signal processor 116 provides control signals for controlling the position of print head 108 relative to chuck 104 and control signals for controlling the process parameters for dispensing drops of the coating material from the print head. Print head 108 and positioner 110 respond to the control signals from digital signal processor 116 and carry out the desired coating operation. It will be apparent to those skilled in the art that print head 108 and positioner 110 may be controlled to form a film on the surface of wafer 106 having any desired pattern. By way of example, the film may be a single continuous film or the film may be a plurality of discrete islands.

Figure 2A:
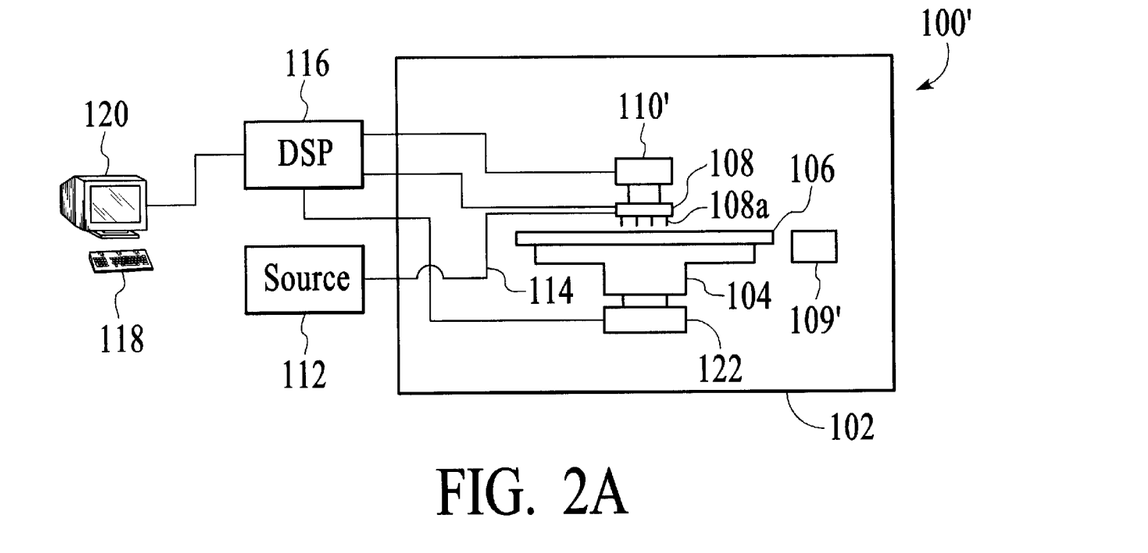
FIG. 2A is a simplified schematic diagram of a system for coating a wafer in accordance with another embodiment of the present invention.
Figure 2B:
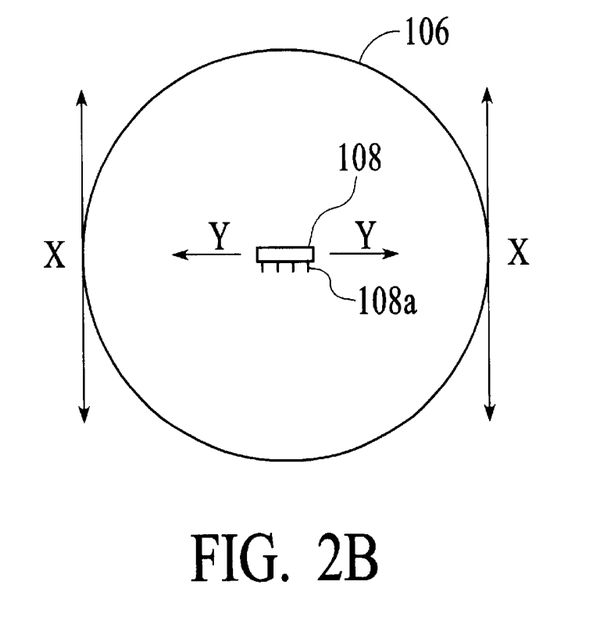
FIG. 2B is a simplified schematic diagram that illustrates the manner in which the print head and the wafer move relative to one another during a coating operation using the system shown in FIG. 2A.

FIG. 2A is a simplified schematic diagram of a system for coating a semiconductor wafer in accordance with another embodiment of the present invention. As shown in FIG. 2A, system 100' is a modified version of system 100 shown in FIG. 1A in which positioner 110' moves print head 108 only in the Y dimension, as shown in FIG. 2B. Positioner 122, which is coupled to digital signal processor 116, moves chuck 104 (and hence wafer 106 supported thereon) only in the X dimension, as shown in FIG. 2B. Positioner 122 may be any suitable transport mechanism for precisely moving the chuck in one dimension. In one embodiment, positioner 122 is a linear motor. Positioners 110' and 122 may be used to control the relative movement of print head 108 and chuck 104, respectively, so that the print head moves over the surface of wafer 106 along any desired path. Maintenance station 109' is situated proximate to chuck 104 along the path of movement followed by positioner 110' so that the positioner can move print head 108 to the maintenance station.

Figure 3A:
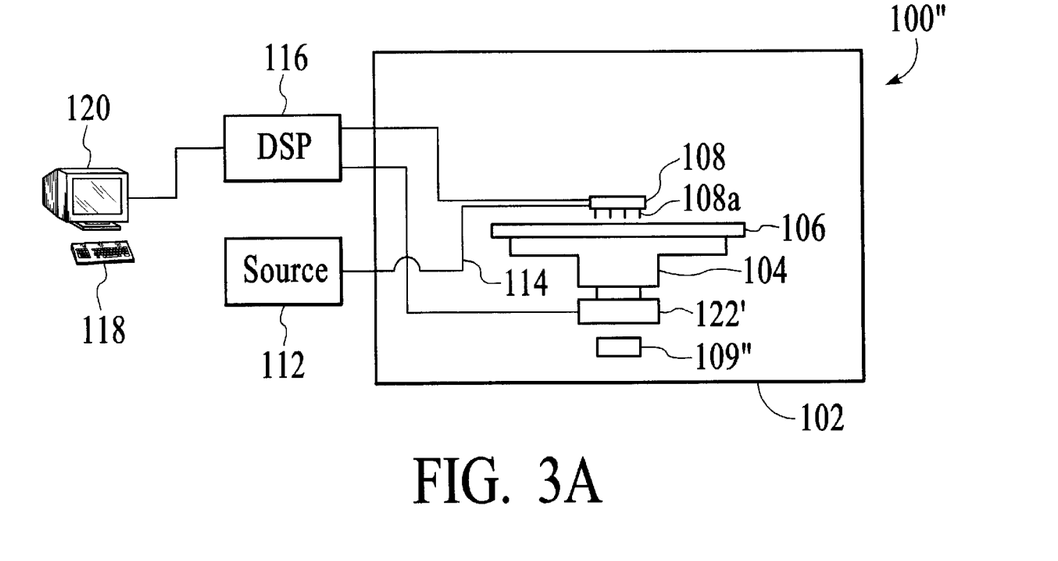
FIG. 3A is a simplified schematic diagram of a system for coating a wafer in accordance with yet another embodiment of the present invention.
Figure 3B:
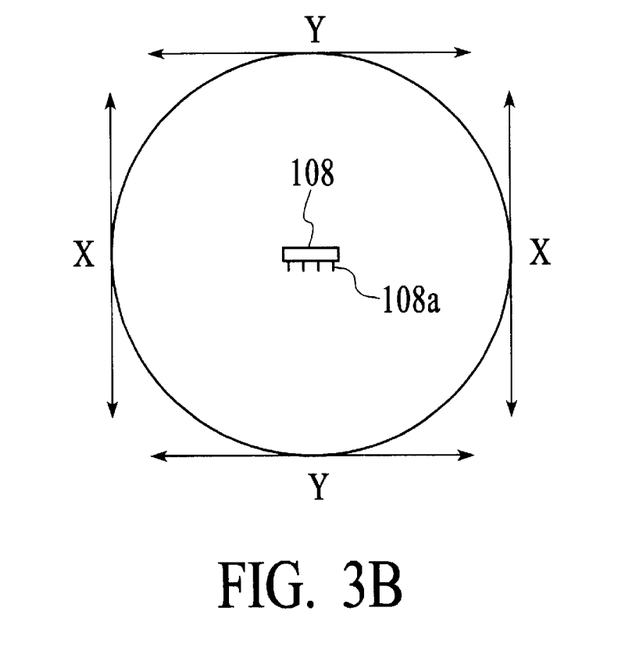
FIG. 3B is a simplified schematic diagram that illustrates the manner in which the wafer moves relative to the print head during a coating operation using the system shown in FIG. 3A.

FIG. 3A is a simplified schematic diagram of a system for coating a semiconductor wafer in accordance with yet another embodiment of the present invention. As shown in FIG. 3A, system 100" is a modified version of system 100 shown in FIG. 1A in which positioner 110 is omitted so that print head 108 remains stationary over wafer 106. Positioner 122', which is coupled to digital signal processor 116, moves chuck 104 (and hence wafer 106 supported thereon) in both the X and Y dimensions, as shown in FIG. 3B. Positioner 122' may be any suitable transport mechanism for precisely moving the chuck in two dimensions. In one embodiment, positioner 122' is a motorized, two-axis (X-Y) stage. By way of example, positioner 122' may move chuck 104 (and hence wafer 106 supported thereon) under print head 108 in a systematic, back-and-forth manner in which the wafer first moves up (or down) a first "column" in the X dimension, then moves under the print head in the Y dimension to a second column, and then moves down (or up) the second column in the X dimension. This back-and-forth movement may be repeated until the all of the selected surface of wafer 106 that is to be coated has moved under print head 108. Maintenance station 109" is movably disposed in housing 102 at any suitable location that allows the maintenance station to be moved to stationary print head 108. In one embodiment, maintenance station 109" is located directly below print head 108 and chuck 104. To perform maintenance operations with this configuration, chuck 104 is first moved out of the way and then maintenance station 109" is raised up to print head 108 with a suitable transport mechanism.

Each of the system configurations shown in FIGS. 1A, 2A, and 3A has advantages and disadvantages relative to the other configurations. The configuration of system 100 shown in FIG. 1A in which the print head moves in both the X and Y dimensions is advantageous because it has the smallest possible footprint. The primary disadvantages of the configuration of system 100 are that movable cables/lines are required in the X and Y dimensions and that pressure fluctuations may occur in the print head and the supply lines due to movement of the print head. The configuration of system 100' shown in FIG. 2A in which the wafer moves in the X dimension and the print head moves in the Y dimension is advantageous because movable cables/lines are needed in only the Y dimension, the coating material may be dispensed while the print head is stationary (the print head moves only when shifting to a new "column" and no dispensing occurs during this movement), and the print head can be moved to a maintenance station. The primary disadvantage of the configuration of system 100' is that it has a larger footprint than that of system 100. The configuration of system 100" shown in FIG. 3A in which the chuck (and hence the wafer supported thereon) moves in the X and Y dimensions is advantageous because it does not require movable cables/lines for the print head and is not subject to pressure fluctuations in the print head and supply lines because the print head is stationary. The primary disadvantages of the configuration of system 100" are that it has the highest possible footprint of the three configurations and that there is no easy way to hook the stationary print head up to a maintenance station.

Figure 4:
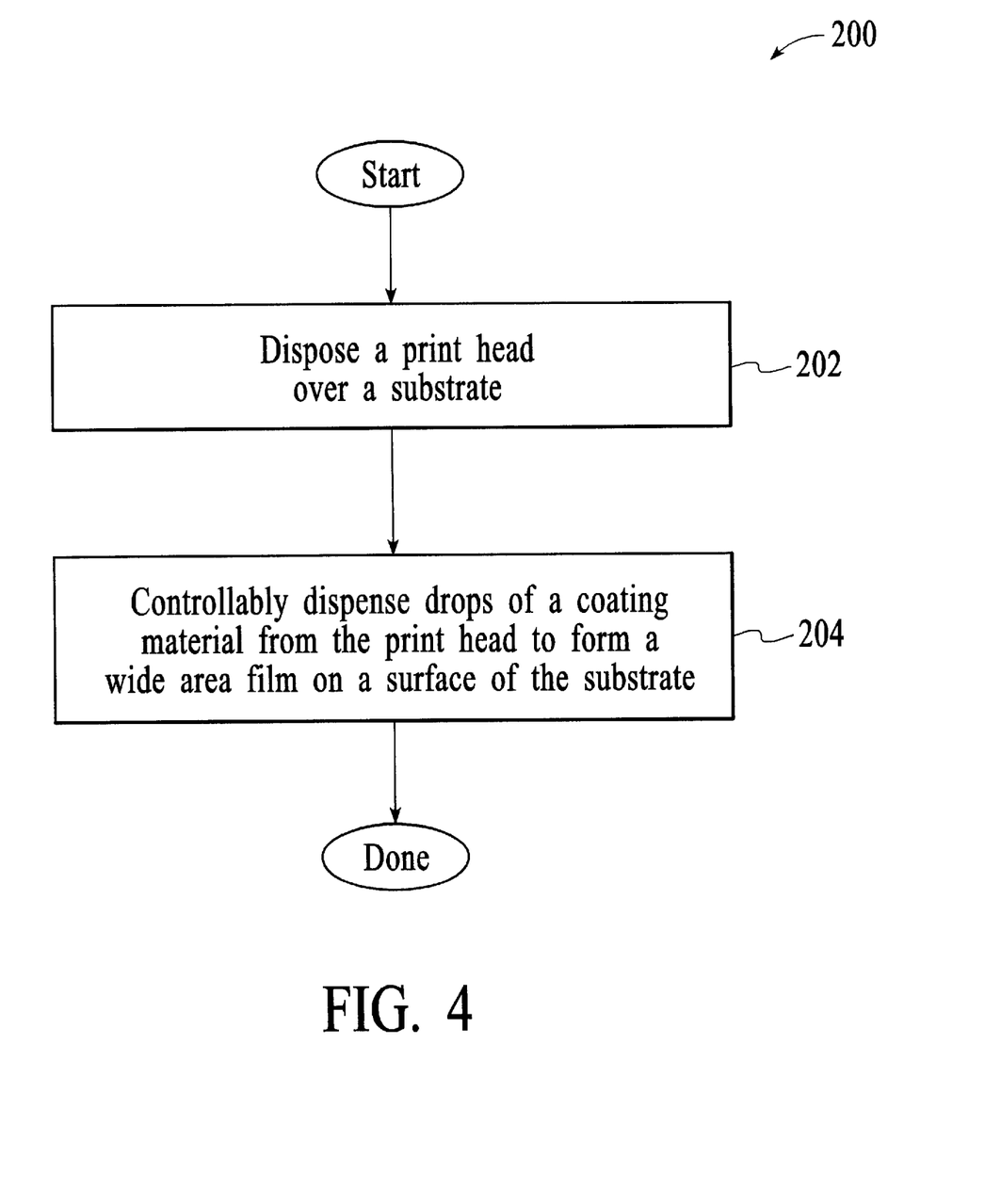
FIG. 4 is a flowchart diagram illustrating the method operations performed in applying a coating material on a substrate in accordance with one embodiment of the present invention.

FIG. 4 is a flowchart diagram 200 illustrating the method operations performed in applying a coating material on a substrate in accordance with one embodiment of the invention. The method begins in operation 202 in which a print head is disposed over a substrate. As set forth above, the print head may be any suitable commercially available ink jet print head and, if necessary, may be modified to avoid contaminating the substrate. In one embodiment, the substrate is a semiconductor, e.g., silicon (Si), gallium arsenide (GaAs), and silicon germanium (SiGe), an insulator, e.g., glass, or a conductor, e.g., aluminum (Al) and copper (Cu). There is no restriction on the shape of the substrate. Accordingly, the substrate may have a circular, rectangular, square, or any other type of shape.

In operation 204, drops of a coating material are controllably dispensed from the print head to form a wide area film on a surface of the substrate. By way of example, suitable coating materials include polymers, solvent media with solute, aqueous media with solute, and dispersed colloidal suspensions. In the case of suspensions, it may be necessary to agitate the suspension prior to dispensing to avoid settling. Examples of suitable coating materials used in the fabrication of semiconductor devices include low dielectric constant materials (sometimes referred to as "low k materials"), photoresist materials, and antireflective coating materials. As used in connection with the description of the invention, the term "low dielectric constant material" refers to any material having a dielectric constant, k, below that of silicon dioxide (k=3.9). The viscosity of low dielectric constant materials, photoresist materials, and antireflective coating materials used in the fabrication of semiconductor devices typically ranges from about 3 cps to about 50 cps. Additional details regarding the process parameters that may be used to dispense drops of the coating material from the print head to form a wide area film are described below with reference to FIGS. 5A–5E and 6A–6D. Once the wide area film is formed on the surface of the substrate, the method is done.

Figure 5A:
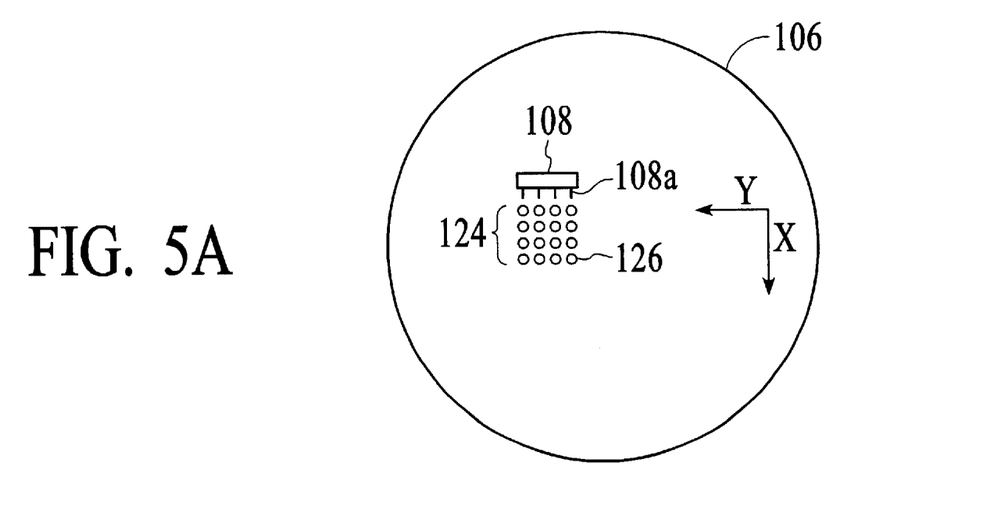
FIG. 5A is a schematic diagram that illustrates a pattern of dots formed on a substrate by a print head implementing process parameters used in conventional ink jet printing.

FIG. 5A is a schematic diagram that illustrates a pattern of dots formed on a substrate by a print head implementing process parameters used in conventional ink jet printing, e.g., the printing of documents or pictures on paper or plastic media. As shown in FIG. 5A, the drops dispensed from nozzles 108a of print head 108 form pattern 124 on wafer 106. Pattern 124 consists of a plurality of separated dots 126 and is therefore not suited for use in applications that require wide area film coverage on the substrate.

Figure 5B:
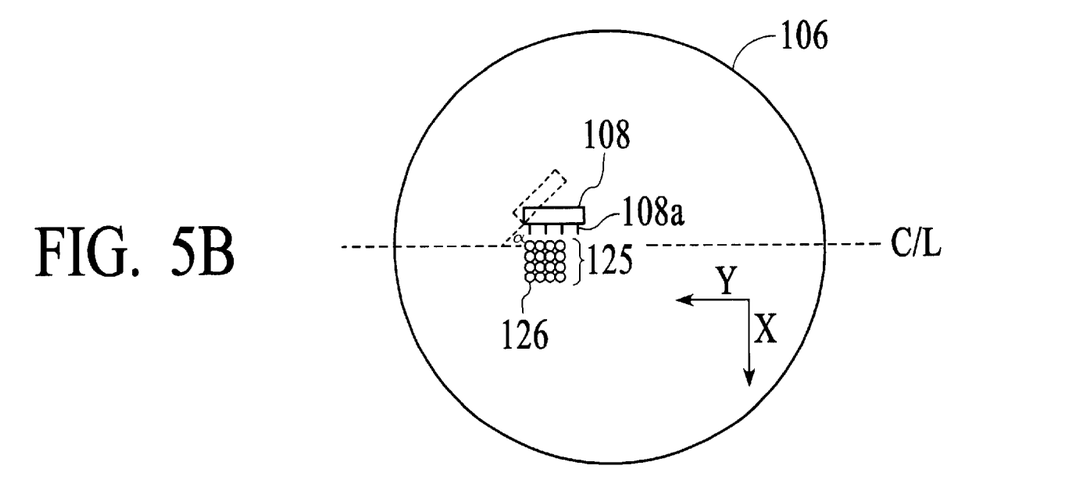
FIG. 5B is a schematic diagram that illustrates a pattern of dots formed on a substrate by a print head implementing one set of process parameters adapted to form a wide area film.

FIG. 5B is a schematic diagram that illustrates a pattern of dots formed on a substrate by a print head implementing one set of process parameters adapted to form a wide area film. As shown in FIG. 5B, wide area film 125 includes a plurality of dots 126 that overlap in both the X and Y dimensions. In one embodiment, the firing frequency may be controlled so that the dots overlap in the X dimension. In one embodiment, the offset angle of the print head may be controlled so that the dots overlap in the Y dimension. The offset angle, $\alpha$, shown in FIG. 5B is the angle defined by the print head (or an extension thereof) and a horizontal centerline of the substrate. It will be apparent to those skilled in the art that, if desired, the nozzles may be offset with respect to the horizontal centerline of the substrate without adjusting the position of the print head. For example, the structure of the print head may be modified such that the nozzles are situated on the print head at the desired offset angle.

Figure 5C:
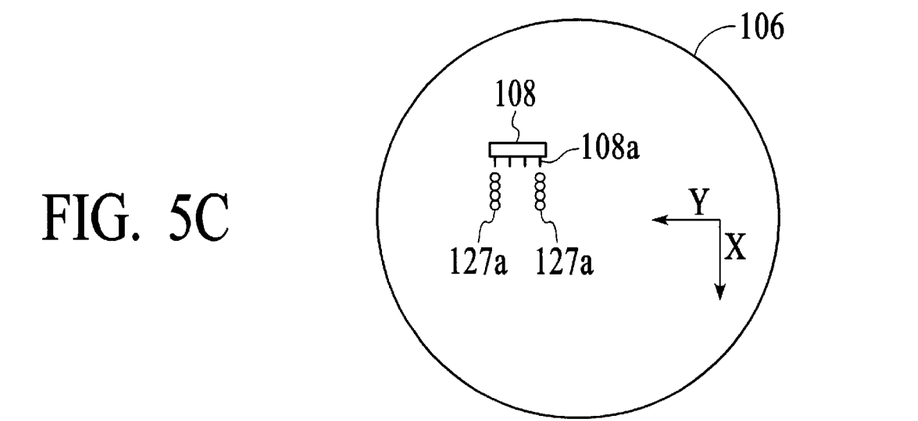
FIG. 5C shows two sets of dots formed during a first pass of the print head over the wafer.
Figure 5D:
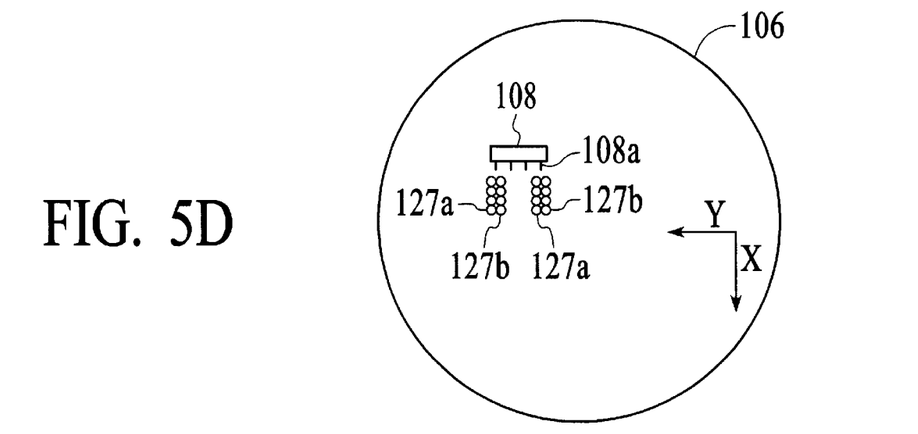
FIG. 5D shows two additional sets of dots formed during a second pass of the print head over the wafer.
Figure 5E:
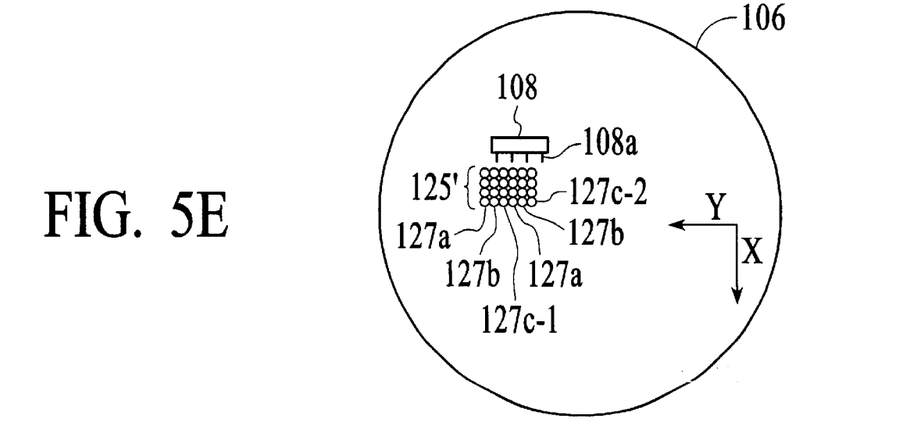
FIG. 5E shows two additional sets of dots formed during a third pass of the print head over the wafer.

FIGS. 5C–5E are schematic diagrams that illustrate the formation of a pattern of dots on a substrate by a print head implementing another set of process parameters adapted to form a wide area film. In particular, FIGS. 5C–5E illustrate how a wide area film may be formed by changing the pitch of the print head in successive passes over the substrate. FIG. 5C shows two sets of dots 127a formed during a first pass of print head 108 over wafer 106. Dots 127a may be formed so that they overlap in the X dimension, as described above. FIG. 5D shows two additional sets of dots 127b formed during a second pass of print head 108 over wafer 106. Dots 127b may be formed so that they overlap in the X dimension and overlap one or more of dots 127a in they Y dimension. FIG. 5E shows two additional sets of dots 127c-1 and 127c-2 formed during a third pass of print head 108 over wafer 106. The formation of dots 127c-1 and 127c-2 completes the formation of wide area film 125'. Dots 127c-1 may be formed so that they overlap in the X dimension and overlap one or more of adjacent dots 127a and one or more of adjacent dots 127b in the Y dimension. Dots 127c-2 may be formed so that they overlap in the X dimension and overlap one or more adjacent dots 127b in the Y dimension. After the first pass, the pitch of print head 108 may be selected for each successive pass to obtain the desired degree of overlap in the Y dimension. Those skilled in the art will recognize that the multiple pass approach illustrated in FIGS. 5C–5E may be repeated over selected portions of a substrate to form either a continuous wide area film or a plurality of discrete wide area films.

Figure 6A:
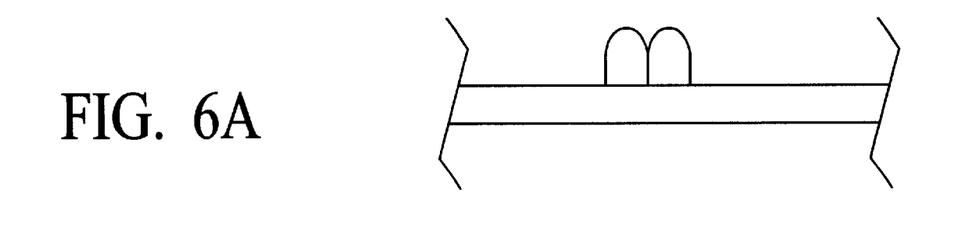
FIG. 6A is a simplified cross-sectional view of an exemplary wide area film including two overlapping dots formed on a substrate.

As used in connection with the description of the invention, the term "wide area film" refers to a homogeneous film created by overlapping dots of a coating material on a substrate. The degree to which the dots overlap may be varied. At a minimum, the dots can be arranged so that each dot touches at least one other dot. At a maximum, the dots can have just less than 100% overlap, i.e., the dots are substantially formed on top of one another. In accordance with the invention, a wide area film can be formed by as few as two overlapping dots, as illustrated in FIG. 6A. Depending on the drop size, the size of a wide area film formed by two overlapping dots can be as small as about 150 $\mu$m. Those skilled in the art will recognize that there is no upper limit to the size of a wide area film formed in accordance with the invention. Exemplary process parameters that may be used to form a wide area film are listed in Table 1. Those skilled in the art will recognize that the parameter entitled "Voltage level on piezo" applies only to piezoelectric actuated print heads. The other process parameters listed in Table 1 may be used with either piezoelectric actuated print heads or print heads using other types of actuation, e.g., electromagnetic, pneumatic, or thermal.

TABLE 1

Figure 6B:
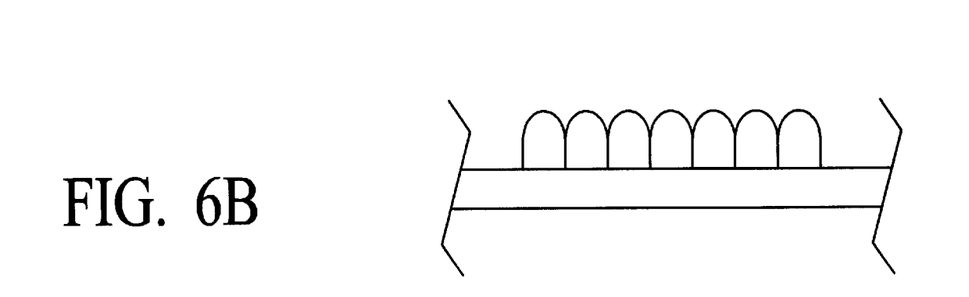
FIG. 6B is a simplified cross-sectional view of an exemplary ultraflat wide area film formed on a substrate.

Number of Print heads: 1 to 100
Number of nozzles: 2 to 120
Nozzle size: 30 um to 200 $\mu$m
Nozzle pitch: 30 um to 200 $\mu$m
Nozzle/print head scanning frequency: 0.01 meter/sec to 10 meters/sec
Nozzle firing frequency: 300 Hz to 10 kHz
Firing distance between nozzle and substrate: 0.1 mm to 10 mm
Nozzle pulsing: single or double
Pulsing time (varies drop size): 1 $\mu$sec to 50 $\mu$sec
Voltage level on piezo (varies drop size): 20 volts to 200 volts
Single drop size: 60 $\mu$m to 400 $\mu$m
Single drop mass: 20 picoliters to 8,000 picoliters
Nozzle temperature: 0° C. to 80° C.
Print head (or nozzle) offset angle: 0 degrees to slightly less than 90 degrees FIG. 6B is a simplified cross-sectional view of an exemplary ultraflat wide area film formed on a substrate. As used herein, the term "ultraflat" means that the thickness of the film varies over the substrate by 3% or less. To obtain an ultraflat wide area film, it may be necessary to control the nozzles of the print head individually so that each nozzle dispenses the same volume of coating material per shot. Alternatively, it may be necessary to control the nozzles of the print head individually so that some or all of the nozzles dispense different volumes of coating material per shot.

Thin films also may be characterized in terms of surface roughness. The surface roughness of a thin film may be determined by measuring the difference in height between the peaks and valleys in the surface of the thin film. This measurement is typically performed in a 1 µm×1 µm area on the wafer using an atomic force microscope (AFM) technique. For a typical dielectric film, the surface roughness can range from about 10 Å to about 500 Å. In preliminary testing, it has been observed that the surface roughness of wide area films formed using the ink jet printing technique described herein is approximately 50% lower than that of spin-coated films.

Figures 6B, 6C:
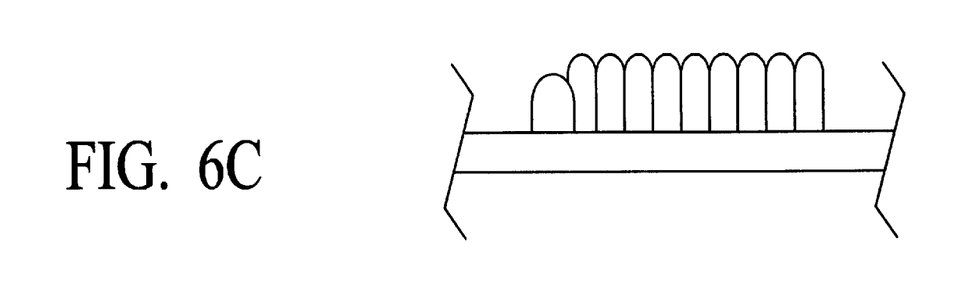
FIG. 6C is a simplified cross-sectional view that shows the exemplary ultraflat wide area film of FIG. 6B formed with a higher degree of overlap.
Figure 6D:
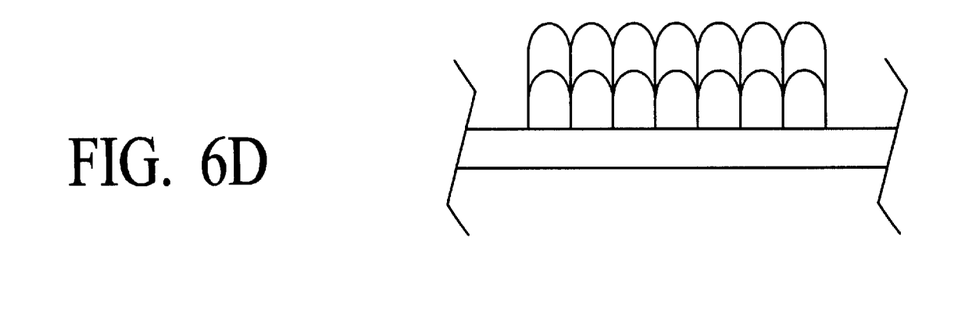
FIG. 6D is a simplified cross-sectional view that shows an exemplary ultraflat wide area film having two levels of overlapping dots.

Wide area films having any desired film thickness may be formed by varying the process parameters used to dispense the coating material. This is significant because it enables different thickness requirements to be met using the same coating material. For example, for a given drop size, a slightly thicker film may be formed by adjusting the process parameters to increase the degree to which the dots formed on the substrate overlap. To illustrate this point, FIG. 6C shows the wide area film of FIG. 6B formed with a higher degree of overlap. A significantly thicker film may be formed by forming multiple levels of overlapping dots on the substrate. To illustrate this point, FIG. 6D shows a wide area film having two levels of overlapping dots. By way of example, one way to form multiple levels of overlapping dots is to increase the firing frequency during a single pass. Another way is form multiple levels of overlapping dots is to perform multiple passes over the substrate. Depending on the coating material, the thickness of the wide area film may be varied from about 0.1 µm to about 60 µm to meet the demands of particular applications. Those skilled in the art will recognize that the thickness of the wide area film may be varied over the substrate. By way of example, a thinner film may be formed on the tops of structures, e.g., transistors, and a thicker film may be formed in the valleys between the structures.

Figure 7A:
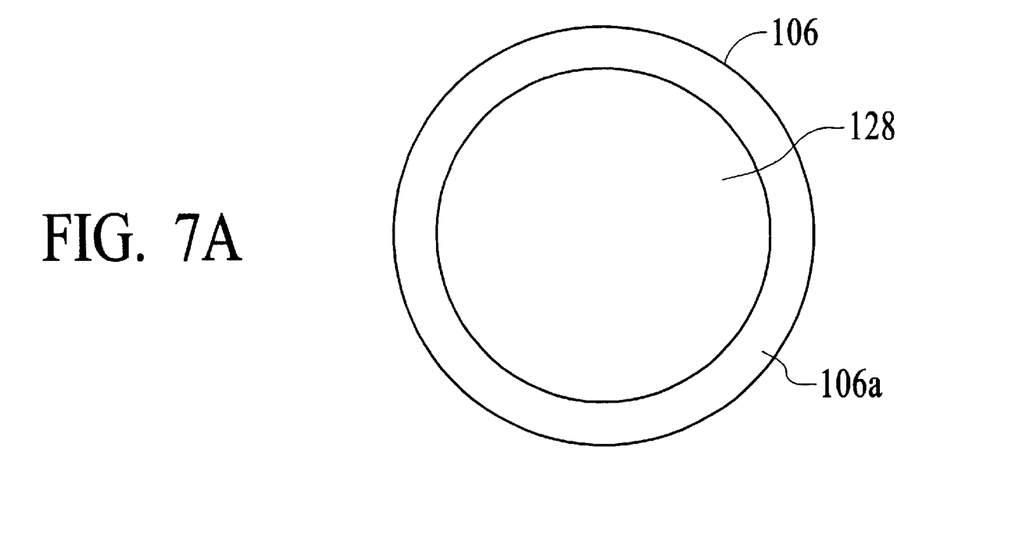
FIG. 7A shows a semiconductor wafer having an exemplary wide area film that does not cover the edge exclusion area formed thereon.
Figure 7B:
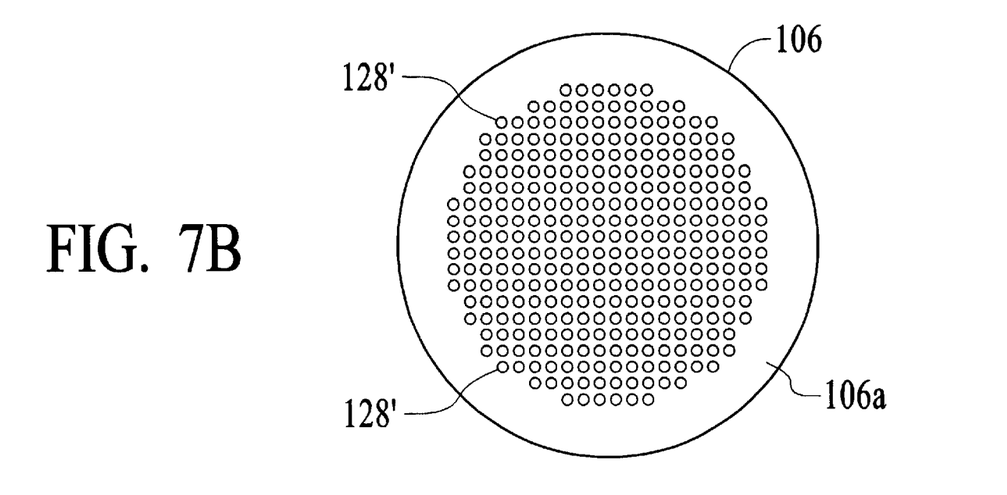
FIG. 7B shows a semiconductor wafer having an exemplary wide area film that includes a plurality of discrete islands formed thereon.

Wide area films having any desired pattern can be formed on a substrate by dispensing coating material on only those portions of the substrate where film coverage is desired. FIG. 7A shows a semiconductor wafer having one exemplary wide area film formed thereon. As shown in FIG. 7, continuous wide area film 128 formed on the surface of wafer 106 does not cover the edge exclusion area 106a of the wafer. This is advantageous because it not only conserves coating material, but also avoids the need for edge bead removal. FIG. 7B shows a semiconductor wafer having another exemplary wide area film formed thereon. As shown in FIG. 7B, the wide area film includes a plurality of discrete islands 128' formed on the surface of wafer 106. In one embodiment, each island 128' may be formed on a different die of wafer 106.

The system and method for coating substrates of the present invention provide a number of significant advantages relative to spin coating. These advantages include conserving expensive coating material (because the print head dispenses coating material onto only those portions of the substrate where film coverage is desired), eliminating the need for edge bead removal (because a film is not formed on the edge exclusion area), eliminating the need for waste management (because coating material is not wasted and no edge bead removal, which uses solvents, is needed), and eliminating the need for backside rinsing (because coating material is not deflected onto the backside of the substrate during the coating operation). The system and method of the present invention are further advantageous because they enable the pattern, thickness, thickness profile, and smoothness of a film to be modulated over the substrate.

In summary, the present invention provides a system and method for coating substrates. The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

What is claimed is:

1. A system for coating a semiconductor wafer, comprising:
   a housing;
   a chuck for supporting a semiconductor wafer disposed in the housing;
   a print head movably disposed in the housing above the chuck, the print head being movable in first and second dimensions over the chuck;
   a source of a coating material coupled to the print head; and
   a digital signal processor for providing control signals for controlling process parameters for dispensing drops of the coating material from the print head and for providing control signals for controlling a position of the print head relative to the chuck.

2. The system of claim 1, wherein the process parameters for dispensing drops of the coating material from the print head and the position of the print head relative to the chuck are controlled to form a wide area film on a surface of a semiconductor wafer being supported on the chuck.

3. The system of claim 1, wherein the first and second dimensions define a plane over the chuck, and the print head is movable in the plane.

4. The system of claim 1, wherein the coating material is selected from the group consisting of a low dielectric constant material, a photoresist material, and an antireflective coating material.

5. The system of claim 1, further comprising a maintenance station for performing maintenance operations on the print head.

6. A system for coating a semiconductor wafer, comprising:
   a housing;
   a print head disposed in the housing;
   a chuck for supporting a semiconductor wafer movably disposed in the housing below the print head, the chuck being movable in first and second dimensions under the print head;
   a source of a coating material coupled to the print head; and
   a digital signal processor for providing control signals for controlling process parameters for dispensing drops of the coating material from the print head and control signals for controlling a position of the chuck relative to the print head.

7. The system of claim 6, wherein the process parameters for dispensing drops of the coating material from the print head and the position of the print head relative to the chuck are controlled to form a wide area film on a surface of a semiconductor wafer being supported on the chuck.

8. The system of claim 6, wherein the first and second dimensions define a plane under the print head, and the chuck is movable in the plane.

9. The system of claim 6, wherein the coating material is selected from the group consisting of a low dielectric constant material, a photoresist material, and an antireflective coating material.

10. The system of claim 6, further comprising a maintenance station for performing maintenance operations on the print head.

11. A system for coating a semiconductor wafer, comprising:
- a housing;
- a chuck for supporting a semiconductor wafer movably disposed in the housing, the chuck being movable in a first dimension;
- a print head movably movably disposed in the housing above the chuck, the print head being movable in a second dimension;
- a source of a coating material coupled to the print head; and
- a digital signal processor for providing control signals for controlling process parameters for dispensing drops of the coating material from the print head, control signals for controlling a position of the chuck relative to the print head in the first dimension, and control signals for controlling a position of the print head relative to the chuck in the second dimension.

12. The system of claim 11, wherein the process parameters for dispensing drops of the coating material from the print head, the position of the chuck relative to the print head in the first dimension, and the position of the print head relative to the chuck in the second dimension are controlled to form a wide area film on a surface of a semiconductor wafer being supported on the chuck.

13. The system of claim 11, wherein the first dimension is an X dimension and the second dimension is a Y dimension.

14. The system of claim 11, wherein the coating material is selected from the group consisting of a low dielectric constant material, a photoresist material, and an antireflective coating material.

15. The system of claim 11, further comprising a maintenance station for performing maintenance operations on the print head.

* * * * *